(12) United States Patent
Jarvis et al.

(10) Patent No.: US 10,246,562 B2
(45) Date of Patent: Apr. 2, 2019

(54) PLASTICS COLOURATION

(75) Inventors: Anthony Jarvis, Widnes (GB); Adam O'Rourke, Widnes (GB); Ben Mulchin, Widnes (GB)

(73) Assignee: DATALASE LTD., Cheshire (GB)

( * ) Notice: Subject to any disclaimer, the term of this patent is extended or adjusted under 35 U.S.C. 154(b) by 0 days.

(21) Appl. No.: 13/638,011

(22) PCT Filed: Oct. 7, 2010

(86) PCT No.: PCT/GB2010/051677
§ 371 (c)(1),
(2), (4) Date: Mar. 19, 2013

(87) PCT Pub. No.: WO2011/121265
PCT Pub. Date: Jun. 10, 2011

(65) Prior Publication Data
US 2013/0196176 A1    Aug. 1, 2013

(30) Foreign Application Priority Data

Apr. 1, 2010  (WO) ................ PCT/GB2010/050582

(51) Int. Cl.
| | | |
|---|---|---|
| *C08J 3/20* | (2006.01) | |
| *B41M 5/28* | (2006.01) | |
| *B41M 5/323* | (2006.01) | |
| *G03C 1/73* | (2006.01) | |
| *G03F 7/105* | (2006.01) | |
| *B41M 5/26* | (2006.01) | |
| *B41M 5/337* | (2006.01) | |

(52) U.S. Cl.
CPC .............. *C08J 3/203* (2013.01); *B41M 5/267* (2013.01); *B41M 5/285* (2013.01); *B41M 5/323* (2013.01); *G03C 1/73* (2013.01); *G03F 7/105* (2013.01); *B41M 5/28* (2013.01); *B41M 5/284* (2013.01); *B41M 5/3372* (2013.01); *B41M 5/3377* (2013.01)

(58) Field of Classification Search
CPC ........ C08J 3/203; B41M 5/285; B41M 5/323; B41M 5/267; B41M 5/28; B41M 5/284; B41M 5/3372; B41M 5/3377; G03C 1/73
USPC ..................................... 8/506, 444
See application file for complete search history.

(56) References Cited

U.S. PATENT DOCUMENTS

| | | | |
|---|---|---|---|
| 5,420,000 A | * | 5/1995 | Patel et al. .................... 430/332 |
| 2006/0145091 A1 | * | 7/2006 | Patel .......................... 250/474.1 |
| 2008/0014117 A1 | * | 1/2008 | Questel ..................... A61L 2/28 |
| | | | 422/400 |
| 2009/0191480 A1 | * | 7/2009 | Rogers et al. ............. 430/283.1 |

FOREIGN PATENT DOCUMENTS

| | | | |
|---|---|---|---|
| EP | 2 082 890 A1 | | 7/2009 |
| JP | 2006 063045 A | | 3/2006 |
| JP | 2006063045 | * | 9/2006 |
| WO | WO 2009/093028 A2 | | 7/1990 |
| WO | WO 2010/001171 A1 | | 1/2010 |
| WO | WO 2010/001172 A1 | | 1/2010 |

* cited by examiner

*Primary Examiner* — Amina S Khan
(74) *Attorney, Agent, or Firm* — Saliwanchik, Lloyd & Eisenschenk

(57) ABSTRACT

A method of imparting color to a plastic substrate comprising applying to the substrate, or incorporating within the substrate, a diacetylene compound of general formula (I) wherein n=1 to 20; $R^1$=an optionally substituted $C_{1-20}$ alkyl group which may contain heteroatoms; T=H, an optionally substituted $C_{1-20}$ alkyl group which may contain heteroatoms or —$(CH_2)_m$—C(=O)-$Q^2R^2$; $Q^1$=NH, CO, NHCONH, OCONH, COS, NHCSNH or $NR^3$, wherein m, $Q^2$ and $R^2$ are independently selected from the same groups as n, $Q^1$ and $R^1$ respectively; $R^3$ is an optionally substituted $C_{1-20}$ alkyl group which may contain heteroatoms; and irradiating the substrate to impart color to the substrate is described.

12 Claims, No Drawings

PLASTICS COLOURATION

CROSS REFERENCE TO A RELATED APPLICATION

This application is a National Stage Application of International Application Number PCT/GB2010/051677, filed Oct. 7, 2010; which claims priority to International Application No. PCT/GB2010/050582, filed Apr. 1, 2010; which are incorporated herein by reference in their entirety.

FIELD OF THE INVENTION

The present invention relates to a method of imparting colour to a plastic substrate and to coloured plastic substrates obtained thereby.

BACKGROUND TO THE INVENTION

Certain diacetylenes are known to be capable of forming colour on exposure to light. 10,12-Pentacosadiynoic acid is well known in the art to be an example of such a diacetylene. This compound is initially colourless in its unreacted state, but on exposure to UV light undergoes a topochemical polymerization reaction to generate a blue coloured polydiacetylene, which can then be transformed into a red coloured form by thermal perturbations.

WO06/018640 teaches the application of diacetylenes, such as 10,12-pentacosadiynoic acid, in multi-colour printing applications in combination with a photoacid or photobase generating species. Colour forming diacetylenes, such as 10,12-pentacosadiynoic acid and the like, are typically very reactive, and can undergo the initial polymerization reaction on exposure to fluence values as low as 50 mJcm$^{-2}$. The consequence of this high reactivity is poor stability to background radiation. Light sensitive diacetylenes will gradually polymerise and turn blue on storage, even in the dark as often high light sensitivity is combined with high thermal sensitivity. In order to generate colourless coatings with these compounds it is usually necessary to purify them, via re-crystallisation, prior to use, which is time consuming and wasteful. Also, any coatings made using these diacetylenes will gradually turn blue on exposure to background radiation. This severely limits the range of applications that the coating can be used in.

WO 2009/081385 describes a thermoplastic material comprising a polymer and at least one polychromic substance. The polychromic substance is a functionalized diacetylene. In the Examples, 10,12-Pentacosadiynoic acid is used. The materials may be subject to some discolouration upon prolonged storage in the dark.

SUMMARY OF THE INVENTION

In accordance with a first aspect of the invention there is provided a method of imparting colour to a plastic substrate comprising applying to the substrate, or incorporating within the substrate, a diacetylene compound of general formula (I)

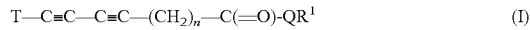

$$T—C\equiv C—C\equiv C—(CH_2)_n—C(=O)\text{-}QR^1 \qquad (I)$$

wherein
n=1 to 20;
R$^1$=an optionally substituted C$_{1-20}$ alkyl group which may contain heteroatoms;
T=H, an optionally substituted C$_{1-20}$ alkyl group which may contain heteroatoms, or —(CH$_2$)$_m$—C(=O)-Q$^2$R$^2$;

Q$^1$=NH, CO, NHCONH, OCONH, COS, NHCSNH or NR$^3$,
wherein m, Q$^2$ and R$^2$ are independently selected from the same groups as n, Q$^1$ and R$^1$ respectively;
R$^3$ is an optionally substituted C$_{1-20}$ alkyl group which may contain heteroatoms;
and irradiating the substrate to impart colour to the substrate.

In accordance with a second aspect of the invention there is provided a coloured plastic substrate obtainable by the method of the first aspect of the invention.

We have observed certain diacetylene compounds that in their initial solid form are unreactive to UV light, and in this initial form are essentially incapable of undergoing light induced colour change reactions. However, when said diacetylene compounds are activated in some manner, for instance by melting and re-solidifying, they irreversibly transform into a solid form that is highly reactive to UV light and will subsequently undergo light induced colour change reactions: colourless to blue to magenta, to red to orange to yellow, and green.

We have found that certain activatable diacetylenes are surprisingly advantageous for use in plastics colouration.

Being activatable, in their powder form they do not discolour on storage and consequently can be stored under ambient conditions without the need for a purification/recrystallation at the time of use. Furthermore, once moulded into a plastic part it has been shown that they surprisingly do not undergo discolouration upon prolonged storage in the dark, particularly upon prolonged storage at raised temperatures. This offers benefits over the Examples in the prior art.

DETAILED DESCRIPTION OF THE INVENTION

Colour Forming Compounds

The present invention makes use of diacetylenes that are 'activatable', i.e. have a first solid form that is relatively unreactive to light, but upon 'activation' are irreversibly transformed into a second form that is relatively reactive to light and are thus capable of undergoing a colour change reaction to create a visible image. Without being limited by theory the activation could be a re-crystallisation, crystal form modification, co-crystal combination or melting/re-solidification process.

Examples of diacetylene carboxylic acid compounds that can be used in the present invention include: 12,14-hexacosadiyndioic acid, 11,13-tetracosadiyndioic acid, 10,12-docosadiyndioic acid, 9,11-eicosadiyndioic acid, 8,10-octadecadiyndioic acid, 7,9-hexadecadiyndioic acid, 6,8-tetradecadiyndioic acid, 5,7-docosadiyndioic acid, 4,6-decadiyndioic acid, 3,5-octadiyndioic acid, 2,4-hexadiyndioic acid, 10,12-pentacosadiynoic acid, 5-7, dodecadiynoic acid, 4,6- dodecadiynoic acid, 5,7-eicosadiynoic acid, 6,8-heneicosadiynoic acid, 8,10-heneicosadiynoic acid, 12,14-heptacosadiynoic acid, 2,4-heptadecadiynoic acid, 4,6-heptadecadiynoic acid, 5,7-hexadecadiynoic acid, 10,12-heneicosaadiynoic acid, 10,12-nonacosadiynoic acid, 10,12-heptacosadiynoic acid, 10,12-octadecadiynoic acid, 10,12-pentacosadiynoic acid, 10,12-tricosadiynoic acid, 6,8-nonadecadiynoic acid, 5,7-octadecadiynoic acid, 10,12-octadecadiynoic acid, 5,7-tetradecadiynoic acid, 10,12-pentacosadiynoic acid and 10,12-docosadiyndioic acid and derivatives thereof are particularly preferred. Where the diacetylene compound is a dicarboxylic acid and derivatives thereof, it can be either symmetrical or unsymmetrical, either with respect to n and/or the alkyl chain length. Preferred diacetylenes are symmetrical about the diacetylene unit, ie. T=(CH2)n-{C=O)-Q1R1.

Other diacetylenes include diacetylene alcohols such as 5,7-eicosaidyn-1-ol and 14-hydroxy-10,12-tetradecadiynoic acid and derivatives thereof.

In the diacetylene compounds of general formula (I) the carboxylic acid group is preferably functionalised into an amide. These compounds can be easily made by reacting a diacetylene carboxylic acid with a chlorinating agent such as oxalyl chloride and then reacting the diacetylene acid chloride with an amine, primary amines being the most preferred.

The primary amine is a compound with the following general structure:

R—NH$_2$ where R is an alkyl group, which can be a straight chain, ring or branched hydrocarbon group. The alkyl chain can comprise hetroatoms such as O, halogens, N, S and the like. It may be substituted with other functional groups such as —OH, —NH$_2$, —SH, and derivatives thereof, aromatic rings, heteroaromatic rings and substituted derivatives thereof. These can be easily made by reacting a diacetylene carboxylic acid with a chlorinating agent such as oxalyl chloride and then reacting the diacetylene acid chloride with the primary amine in the presence of a base. The alkyl chains, R, are saturated, aliphatic hydrocarbon chains, represented by the following formula:

$C_pH_{2p+1}$ where p is an integer ≤20.

The saturated, aliphatic hydrocarbon chains can be either straight chained, rings or branched. Straight chains are particularly preferred. Examples of saturated, aliphatic hydrocarbon chain primary amines comprising 1 to 20 carbon atoms include: methylamine, ethylamine, propylamine, butylamine, pentylamine, hexylamine, heptylamine, octylamine, nonylamine, decylamine, undecylamine, dodecylamine, tridecylamine, tetradecylamine, pentadecylamine, hexadecylamine, heptadecylamine, and octadecylamine, nonadecylamine and eicosamine.

Other amines that can be used to create irreversibly activatable diacetylenes for use in plastics colouration as part of the present invention include: alcoholamines, these are compounds that comprise at least one amino group (—NH$_2$) and at least one hydroxyl group (—OH). Examples include ethanolamine and the like. Also included are amino-PEGs and the like.

Where the diacetylene carboxylic acid compound comprises more than one carboxylic acid group any number of them can be derivatised into an alkylamide. E.g. 10,12-docosadiyndioic comprises two carboxylic acid groups, one or two of them can be derivatised to give rise to the mono or bis-alkylamide compounds. For 10,12-docosadiyndioic-bis-alkylamide compounds made from saturated, straight chain hydrocarbon, aliphatic amines it has been surprisingly found that for heat activation to occur p in the above alkyl chain formula should generally be in the range 6 to 20. When p≤5 heat activation generally does not occur (these alkyl-amide compounds are light reactive as formed). Particularly preferred 10,12-docosadiyndioic-bis-alkylamides are those made from straight alkyl chains comprising an even number of carbon atoms i.e. p=6, 8, 10, 12, 14, 16, 18 and 20.

In preferred diacetylenes of general formula I, n=8. A particularly preferred compound for use in the invention is 10,12-dososadiyn-bis-octadecylamide:

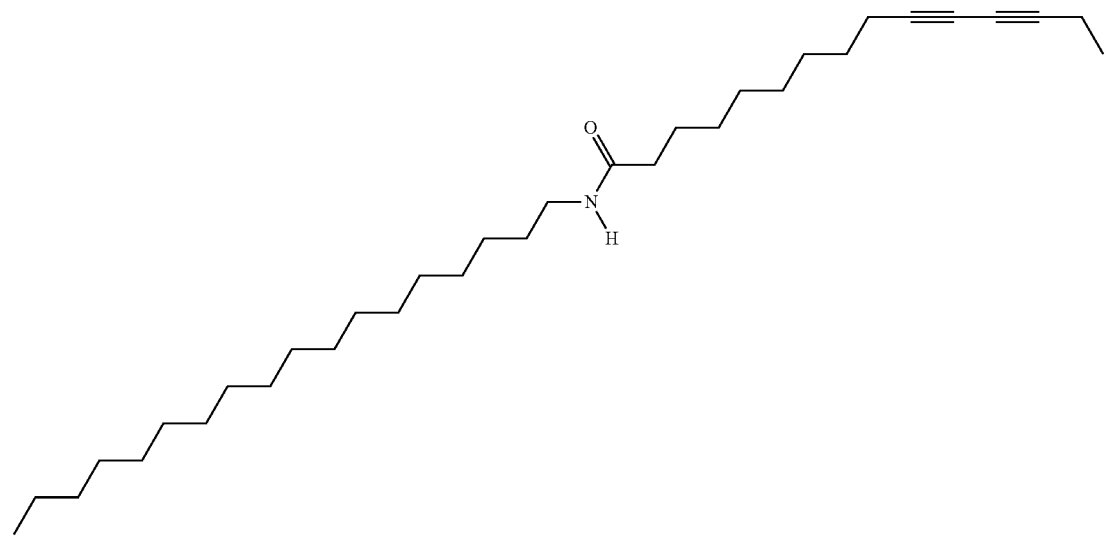

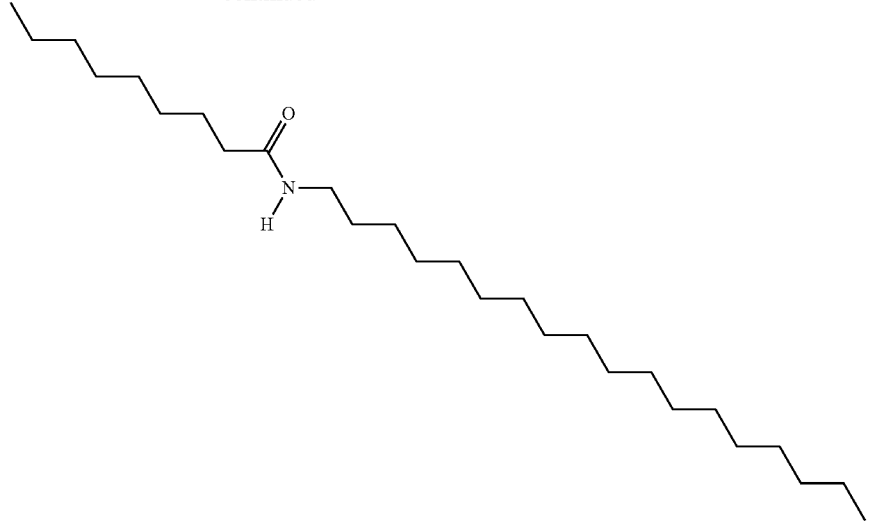

This is irreversibly heat activated, then light reactive as formed.

NIR Light Absorbing Agent

NIR light absorbing agents are compounds that absorb light in the wavelength range 700 to 2500 nm. They may be used together with the diacetylene compound. Specific examples of the type of compound that form may be used in the present invention include but are not limited to:
  i. Organic NIR absorbing agents
  ii. NIR absorbing 'conductive' polymers
  iii. Inorganic NIR absorbing agents
  iv. Non-stoichiometric inorganic NIR absorbing agents.

Particularly preferred NIR absorbing agents are those that have essentially no absorbance in the visible region of the spectrum (400 to 700 nm) and thus give rise to coatings that appear visibly colourless.

Organic NIR absorbing agents are known as NIR dyes/pigments. Examples include but are not limited to: families of metallo-porphyrins, metallo-thiolenes and polythiolenes, metallo-phthalocyanines, aza-variants of these, annellated variants of these, pyrylium salts, squaryliums, croconiums, amminiums, diimoniums, cyanines and indolenine cyanines.

Examples of organic compounds that can be used in the present invention are taught in U.S. Pat. No. 6,911,262, and are given in Developments in the Chemistry and Technology of Organic dyes, J Griffiths (ed), Oxford: Blackwell Scientific, 1984, and Infrared Absorbing Dyes, M Matsuoka (ed), New York: Plenum Press, 1990. Further examples of the NIR dyes or pigments of the present invention can be found in the Epolight™ series supplied by Epolin, Newark, N.J., USA; the ADS series supplied by American Dye Source Inc, Quebec, Canada; the SDA and SDB series supplied by HW Sands, Jupiter, Fla., USA; the Lumogen™ series supplied by BASF, Germany, particularly Lumogen™ IR765, IR788 and IR1050; and the Pro-Jet™ series of dyes supplied by Fuji-Film Imaging Colorants, Blackley, Manchester, UK, particularly Pro-Jet™ 830NP, 900NP, 825LDI and 830LDI. Further examples are sold by HW Sands and Few Chemicals GmbH. Further examples are taught in WO08/050153.

Examples of NIR absorbing 'conductive' polymers include PEDOT such as, the Clevios range of products supplied by HC Starck. Further examples are taught in WO05/12442.

Examples of inorganic NIR absorbing agents include copper (II) salts. Copper (II) hydroxyl phosphate (CHP) is particularly preferred. Further examples are taught in WO05/068207.

Examples of non-stoichiometric inorganic absorbing agents include reduced indium tin oxide, reduced antimony tin oxide and reduced titanium nitrate, reduced zinc oxide. Further examples are taught in WO05/095516. Reduced indium tin oxide is particularly preferred in combination with a 1550 nm to 2500 nm laser. Doped inorganic NIR absorbers also form part of the present invention.

It is particularly preferred if the absorption profile of the NIR absorbing agent approximately matches the emission wavelength(s) of the NIR light source employed.

NIR absorbing agents are preferred however, the invention is not limited to these. Other light absorbing agents that can be used include UV (200 to 400 nm), visible (400 to 700 nm) and mid-infrared (~10.6 microns) light absorbing agents. Examples includes dyes/pigments, UV absorbers and Iriodin type agents.

Other Colour Change Chemistries

The coatings and substrates of the present invention can also comprise other 'non-activatable' colour change chemistries that are directly responsive to light, in particular laser light. Examples include metal oxyanions, particularly molybdates and borates, more particularly octamolybdates and metaborates with ammonium octamolybdate and sodium metaborate being the most preferred.

The coatings and substrates can also comprise charrable agents such as polysaccharides, carbohydrates, sugars and the like including: cellulose and derivatives thereof, glucose, saccharose, sucrose, maltodextrin, lactose, starch, dextrose and polydextrose and gums.

The coatings and substrates can also comprise metal salts such as base generating agents such as sodium bicarbonate and sodium carbonate.

The coatings and substrates can also comprise colour forming agents such as leuco dyes and charge transfer agents. These can be used in combination with a photo or thermal acid or base generating agents. Particularly preferred photoacid generating agents include "onium types" such as sulphonium or iodonium salts. Further examples of photoacid generating agents include amine adducts of aromatic-sulphonic acids such as amine adducts of dinonyl-naphthalene disulphoic acid and tosylates. Other acid generating 'onium' compounds include ammonium and amine: sulphate, phosphate, hydrogen phosphate, dihydrogen phosphate and borates.

Further examples of the chemistries that can be used in combination with the present invention are taught in WO06/129086, WO07/045912, WO02/068205, WO06/129078, WO04/043704, WO02/074548, WO07/063339, WO06/051309 and WO09/010393.

Plastics Colouration

The 'activatable' diacetylenes can be used for bulk colouration, or for printing images, patterns, devices, machine readable codes and text directly on to the plastic part using either a laser scanning system, an array system or a lamp/mask arrangement. The activatable diacetylene can be delivered to the plastic via a solid or liquid masterbatch system, or as a neat powder. Examples of suitable plastics include but are not limited to: Acrylonitrile butadiene styrene (ABS), Acrylic (PMMA), Celluloid, Cellulose acetate, Cycloolefin Copolymer (COC), Ethylene-Vinyl Acetate (EVA), Ethylene vinyl alcohol (EVOH), Fluoroplastics (PTFE, alongside with FEP, PFA, CTFE, ECTFE, ETFE), Ionomers Kydex, a trademarked acrylic/PVC alloy, Liquid Crystal Polymer (LCP), Polyacetal (POM or Acetal), Polyacrylates (Acrylic), Polyacrylonitrile (PAN or Acrylonitrile), Polyamide (PA or Nylon), Polyamide-imide (PAI), Polyaryletherketone PAEK or Ketone), Polybutadiene (PBD), Polybutylene (PB), Polybutylene terephthalate (PBT), Polycaprolactone (PCL), Polychlorotrifluoroethylene (PCTFE), Polyethylene terephthalate (PET), Polycyclohexylene dimethylene terephthalate (PCT), Polycarbonate (PC), Polyhydroxyalkanoates (PHAs), Polyketone (PK) Polyester Polyethylene (PE) low and high density, Polyetheretherketone (PEEK), Polyetherketonekebne (PEKK),Polyetherimide (PEI), Polyethersulfone (PES), Polysulfone, Polyethylenechlorinates (PEG), Polyimide (PI), Polylactic acid (PLA), Polymethylpentene (PMP), Polyphenylene oxide (PPO), Polyphenylene sulfide (PPS), Polyphthalamide (PPA), Polypropylene (PP), Polystyrene (PS),Polysulfone (PSU), Polytrimethylene terephthalate (PTT), Polyurethane (PU), Polyvinyl acetate (PVA), Polyvinyl chloride (PVC), Polyvinylidene chloride (PVDC), Styrene-acrylonitrile (SAN), fluoropolymers and the like.

The plastic substrate comprising the 'activatable' diacetylene compound can be used to make any plastic parts, examples includes ridged plastic packaging such as preforms, containers, bottles and closures, melt-spun fibres that are used in the manufacture of for example non-woven fabrics for use in pads, nappies, feminine hygiene products and the like, plastic films used for product wrappings and the like. The method of the present invention is particularly suitable for imparting colour and images to plastic parts that are not exposed to prolonged background UV radiation during their lifetime.

Application of the Activatable Diacetylene

The activated diacetylene can be applied to the plastic resin via a solid masterbatch or liquid vehicle, or as a neat powder.

Examples of solid masterbatch and liquid vehicles and dosing systems suitable for use in the present invention are supplied by Americhem of Cuyahoga Falls Ohio, ColorMatrix of Cleveland Ohio, and PolyOne of Avon Lake, Ohio.

The activated diacetylene can be applied at any stage of the plastic processing process and can be applied via injection moulding, extrusion, extrusion blow moulding, melt spinning of plastic fibres, and the like.

Where the irreversibly activatable diacetylene is activated by heat it is understood that by incorporating it into plastic at elevated processing temperatures, close to or above the melting point of the activatable diacetylene, this process will serve to activate the diacetylene and thus after processing into plastic no further activating steps will be required. The part will be ready for UV light induced colouration.

Irreversibly activated diacetylenes that are activated at processing temperatures above the moulding temperature of the plastics also form part of the present invention. When these compounds are used, after moulding into plastic the compounds can be irreversibly activated by the application of an activating means.

Light Sources

The light source used for the initial activation is preferably one that can be used to melt the initially unreactive colour forming diacetylene. It can be in the wavelength range 200 nm to 25 microns. More preferably still it is near-infrared light in the wavelength range 700 to 2500 nm, and even more preferably still approximately corresponds with the absorbance profile of the NIR light absorbing agent used. The light can be broadband or mono-chromatic, non-coherent or laser radiation. Preferably the light is NIR laser radiation. The laser can be a pulse or continuous wave laser, a fibre laser or a diode laser, or an array of diodes. A $CO_2$ laser operating with an approximate wavelength of 10.6 microns is also preferred.

The light used to initiate the colour change reaction of the previously activated colour forming compound can be in the wavelength range 200 nm to 25 microns. More preferably it is UV light in the wavelength range 200 to 400 nm, or short wavelength visible light in the range 400 to 450 nm. The light can be broadband or mono-chromatic, non-coherent or laser radiation. The light can be non-coherent light as supplied by a lamp and is used merely to flood the whole substrate surface with light. Examples of UV light sources that can be used include germicidal lamps and mercury arc lamps. Alternatively, a UV laser or UV diode light source can be used, particularly where more precise placement of light is required. A lamp/mask arrangement can also be used. A $CO_2$ laser operating with an approximate wavelength of 10.6 microns is also preferred, particularly if chemistries responsive to $CO_2$ laser light are also present. Where a laser system is employed it can be a pulsed or continuous wave laser. The light beam can be steered using a mirror based galvanometer type system or emitted from an array of light sources.

The present invention also includes the use of photoacid generators, such as those taught in WO06/018640, to sensitise the diacetylene to light of longer wavelength than its intrinsic absorption, once it has been activated.

Other Additives

The plastic comprising an irreversibly activatable colour forming diacetylene of the present invention can also comprise other additives known in plastics processing. Examples include: UV absorbing agents both organic and inorganic such as zinc oxides, light stabilizing agents, light blockers, colourants such as dyes and pigments, clarifiers, foaming agents, nucleating agents, toners, reheat agents, anti-acetaldehyde agents, gas barriers such as oxygen and carbon dioxide barriers, slip agents, pearlescent pigments, opacifiers such as titanium dioxide, and the like.

EXAMPLES 10,12-Docosadiyndioic Acid Derivatives 10,12-Docosadiyndioic-bis-alkylamides made with saturated, straight chain, primary aliphatic amines where n=1 to 20 were prepared as follows:

10,12-Docosadiyndioic acid was converted into its bis-acid chloride using excess oxalyl chloride.

To a THF solution of 10,12-docosadiyndioic-bis-acid chloride was added an excess of the following amines dissolved in THF in the presence of a base catalyst:—

Methylamine, ethylamine, n-propylamine, n-butylamine, n-pentylamine, n-hexylamine, n-heptylamine, n-octylamine, n-nonylamine, n-decylamine, n-undecylamine, n-dodecylamine, n-tridecylamine, n-tetradecylamine, n-pentylamine, n-hexylamine, n-heptylamine, n-octadecylamine, n-nonadecylamine and n-eicosamine.

The above compounds were injection moulded into LDPE, HDPE, PP and PET at 0.2% to yield a closure comprising the diacetylene.

Activation of the Closure
1. A germicidal UV lamp (emitting at approximately 254 nm) was then used to impart a blue colour to the closure. Heating the blue colour caused it to turn magenta and then red.
2. A 266 nm UV laser was used to write text on to the closure.

The invention claimed is:

1. A method of imparting colour to a plastic substrate, wherein the plastic substrate is selected from packaging, product wrapping films, and melt spun fibres, wherein the plastic substrate is polycaprolactone (PCL) or low density polyethylene (LDPE), wherein said method comprises applying to the substrate, or incorporating within the substrate, a diacetylene compound of general formula (I)

$$R^1Q^1\text{-}C(=O)\text{---}(CH_2)_n\text{---}C\equiv C\text{---}C\equiv C\text{---}(CH_2)_n\text{---}C(=O)\text{-}Q^1R^1 \qquad (I)$$

wherein
n =1 to 20;
$Q^1$=NH or $NR^3$,
$R^3$ is an optionally substituted $C_{1-20}$ alkyl group which may contain heteroatoms; and irradiating the substrate to impart colour to the substrate;
wherein $R^1$ is a saturated aliphatic hydrocarbon group having a chain length of 8 to 20 carbon atoms,
wherein the diacetylene compound is initially applied to the plastic substrate or incorporated within the plastic substrate in an inactive form, and is subsequently activated by an activating stimulus, prior to being irradiated to impart colour to the plastic substrate,
wherein the activating stimulus is selected from heat at a temperature about or above the melting point of the diacetylene compound and near-infrared light in a wavelength range of 700 nm to 2500 nm, and
wherein, when the activating stimulus is near-infrared light, the plastic substrate further comprises a near-infrared light absorbing agent.

2. The method according to claim 1, wherein $Q^1$ is NH.

3. The method according to claim 1, wherein n=8.

4. The method according to claim 1, wherein the plastic substrate is irradiated with light in the wavelength range 200 to 450 nm to impart colour to the substrate.

5. The method according to claim 1, wherein the plastic substrate further comprises a light absorbing agent.

6. The method according to claim 1, wherein the diacetylene compound is incorporated into the plastic substrate when the plastic substrate is in molten form.

7. The method according to claim 1, wherein the diacetylene compound of general formula (I) is selected from:
10,12-docosadiyn-bis-n-octylamide,
10,12-docosadiyn-bis-n-decylamide,
10,12, docosadiyn-bis-n-tetradecylamide,
10,12-docosadiyn-bis-n-hexadecylamide, and
10,12-docosadiyn-bis-n-octadecylamide.

8. The method according to claim 1, wherein $R^1$ is a saturated aliphatic hydrocarbon group having a chain length of 8, 10, 12, 14, 16, 18, or 20 carbon atoms.

9. The method according to claim 1, wherein the plastic substrate is PCL.

10. The method according to claim 1, wherein the plastic substrate is LDPE.

11. The method according to claim 1, wherein the activating stimulus is heat at a temperature about or above the melting point of the diacetylene compound.

12. The method according to claim 1, wherein the activating stimulus is near-infrared light and the plastic substrate further comprises the near-infrared light absorbing agent.

* * * * *